US008949078B2

(12) United States Patent
Berkner et al.

(10) Patent No.: US 8,949,078 B2
(45) Date of Patent: Feb. 3, 2015

(54) FILTER MODULES FOR APERTURE-CODED, MULTIPLEXED IMAGING SYSTEMS

(75) Inventors: Kathrin Berkner, Los Altos, CA (US); Sapna Shroff, Menlo Park, CA (US)

(73) Assignee: Ricoh Co., Ltd., Tokyo (JP)

( * ) Notice: Subject to any disclaimer, the term of this patent is extended or adjusted under 35 U.S.C. 154(b) by 909 days.

(21) Appl. No.: 13/040,809

(22) Filed: Mar. 4, 2011

(65) Prior Publication Data
US 2012/0226480 A1 Sep. 6, 2012

(51) Int. Cl.
*G06F 17/50* (2006.01)
*G01J 1/04* (2006.01)
*G01J 3/02* (2006.01)
*G01J 3/36* (2006.01)
*G01J 3/28* (2006.01)

(52) U.S. Cl.
CPC ............ *G01J 1/0492* (2013.01); *G01J 3/0208* (2013.01); *G01J 3/0229* (2013.01); *G01J 3/36* (2013.01); *G01J 3/2823* (2013.01); *G01J 3/0224* (2013.01); *G02B 2207/129* (2013.01)
USPC .......................................................... 703/1

(58) Field of Classification Search
USPC .......................................................... 703/1
See application file for complete search history.

(56) References Cited

U.S. PATENT DOCUMENTS

| | | | |
|---|---|---|---|
| 5,227,890 A | 7/1993 | Dowski | |
| 5,521,695 A | 5/1996 | Cathey et al. | |
| 5,748,371 A | 5/1998 | Cathey et al. | |
| 5,870,179 A | 2/1999 | Cathey et al. | |
| 5,926,283 A | 7/1999 | Hopkins | |
| 5,982,497 A | 11/1999 | Hopkins | |
| 6,021,005 A | 2/2000 | Cathey et al. | |
| 6,069,738 A | 5/2000 | Cathey et al. | |
| 6,525,302 B2 | 2/2003 | Dowski et al. | |
| 6,842,297 B2 | 1/2005 | Dowski | |
| 6,873,733 B2 | 3/2005 | Dowski | |
| 6,911,638 B2 | 6/2005 | Dowski et al. | |
| 6,940,649 B2 | 9/2005 | Dowski | |
| 7,433,042 B1 | 10/2008 | Cavanaugh et al. | |
| 7,616,841 B2 | 11/2009 | Robinson et al. | |
| 7,616,842 B2 | 11/2009 | Robinson | |
| 7,692,709 B2 | 4/2010 | Robinson et al. | |
| 8,143,565 B2 | 3/2012 | Berkner et al. | |
| 8,248,511 B2 | 8/2012 | Robinson et al. | |
| 2002/0118457 A1 | 8/2002 | Dowski | |
| 2002/0195548 A1 | 12/2002 | Dowski et al. | |
| 2003/0057353 A1 | 3/2003 | Dowski et al. | |
| 2003/0169944 A1 | 9/2003 | Dowski et al. | |
| 2003/0173502 A1 | 9/2003 | Dowski et al. | |
| 2004/0145808 A1 | 7/2004 | Cathey et al. | |
| 2004/0190762 A1 | 9/2004 | Dowski et al. | |
| 2004/0228005 A1 | 11/2004 | Dowski | |

(Continued)

OTHER PUBLICATIONS

Cathey, W. Thomas et al., "New Paradigm for Imaging Systems," Applied Optics, Oct. 10, 2002, pp. 6080-6092, vol. 41.

(Continued)

*Primary Examiner* — Saif Alhija
(74) *Attorney, Agent, or Firm* — Fenwick & West LLP

(57) ABSTRACT

A method for designing the spatial partition of a filter module used in an aperture-multiplexed imaging system. The filter module is spatially partitioned into filter cells, and the spatial partition is designed by considering data captured at the sensor in light of an application-specific performance metric.

20 Claims, 7 Drawing Sheets
(3 of 7 Drawing Sheet(s) Filed in Color)

(56) References Cited

U.S. PATENT DOCUMENTS

| | | | |
|---|---|---|---|
| 2004/0257543 | A1 | 12/2004 | Dowski et al. |
| 2005/0088745 | A1 | 4/2005 | Cathey et al. |
| 2005/0197809 | A1 | 9/2005 | Dowski et al. |
| 2005/0264886 | A1 | 12/2005 | Dowski |
| 2006/0187311 | A1* | 8/2006 | Labaziewicz et al. ..... 348/218.1 |
| 2007/0081224 | A1 | 4/2007 | Robinson et al. |
| 2008/0204744 | A1 | 8/2008 | Mir et al. |
| 2008/0266655 | A1 | 10/2008 | Levoy et al. |
| 2009/0096914 | A1 | 4/2009 | Domenicali |
| 2009/0135282 | A1 | 5/2009 | Gidon |
| 2010/0253941 | A1 | 10/2010 | Brady et al. |
| 2012/0182438 | A1 | 7/2012 | Berkner et al. |

OTHER PUBLICATIONS

Cavanaugh, D.B. et al., "VNIR Hypersensor Camera System," Proc. SPIE, conference Aug. 3, 2009, online publication Aug. 17, 2009, 17 pages, vol. 7457.

Choi, J. et al., "Zoom Lens Design for a Novel Imaging Spectrometer That Controls Spatial and Spectral Resolution Individually," Applied Optics, 2006, pp. 3430-3441, vol. 45.

Elliott, K.H., "A Novel Zoom-Lens Spectrograph for a Small Astronomical Telescope," Mon. Not. R. Astron. Soc., 1996, pp. 158-162, vol. 281.

European Extended Search Report, European Application No. 12157955.1, Mar. 14, 2013, 7 pages.

Fife, K. et al., "A Multi-Aperture Image Sensor with 0.7 Pixels in 0.11 CMOS Technology," IEEE Journal of Solid-State Circuits, Dec. 2008, pp. 2990-3005, vol. 43, No. 12.

Fife, K. et al., "A 3D Multi-Aperture Image Sensor Architecture," Proc. of IEEE Custom Integrated Circuits Conference, 2006, pp. 281-284.

Gehm, M. et al., "Single-Shot Compressive Spectral Imaging with a Dual-Disperser Architecture," Optics Express, Oct. 17, 2007, pp. 14013-14027, vol. 15, No. 21.

Harvey, A.R. et al., "Spectral Imaging in a Snapshot," Proc. of SPIE, 2005, pp. 110-119, vol. 5694.

Harvey, A.R. et al., "Technology Options for Hyperspectral Imaging," Proc. of SPIE, 2000, pp. 13-24, vol. 4132.

Horstmeyer, R. et al., "Flexible Multimodal Camera Using a Light Field Architecture," 2009 IEEE International Conference on Computational Photography, Apr. 16, 2009, pp. 1-8.

Maeda, P. Y. et al., "Integrating Lens Design with Digital Camera Simulation," 5678 SPIE Proceedings SPIE Electronic Imaging, Feb. 2005, pp. 48-58, San Jose, CA.

Shogenji, R. et al., "Multispectral Imaging Using Compound Optics," Optics Express, Apr. 19, 2004, pp. 1643-1655, vol. 12, No. 8.

* cited by examiner

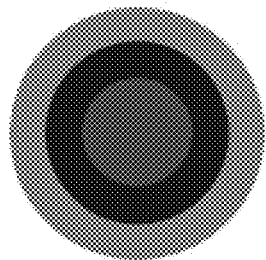 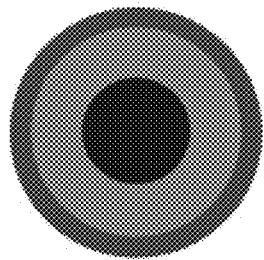 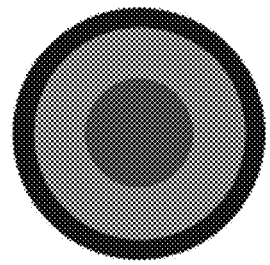
FIG. 5A         FIG. 5B         FIG. 5C
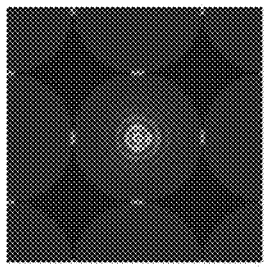 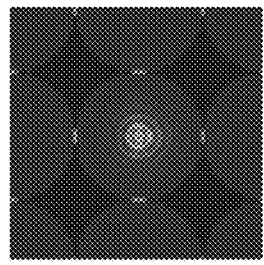 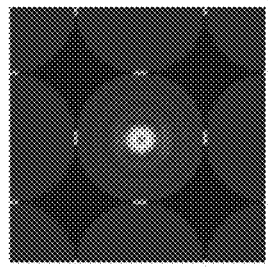
FIG. 9A         FIG. 9B         FIG. 9C
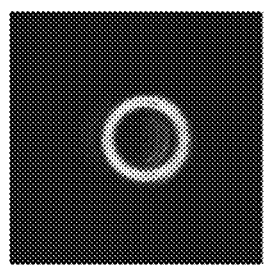 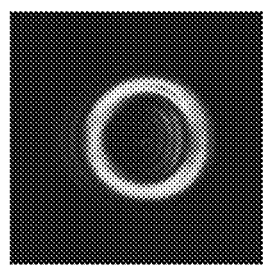 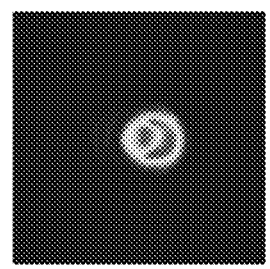
FIG. 10A        FIG. 10B        FIG. 10C

FILTER MODULES FOR APERTURE-CODED, MULTIPLEXED IMAGING SYSTEMS

BACKGROUND OF THE INVENTION

1. Field of the Invention

This invention relates generally to imaging systems that can capture multiple images of the same object simultaneously, for example images of different spectral or polarization components of the object.

2. Description of the Related Art

There are many applications for which it may be useful to capture multiple images of the same object simultaneously. These images may be filtered in different ways, thus providing different information about the object. For example, in multispectral and hyperspectral systems, different wavelength filters may be used to acquire spectral information, and this information may then be used for spectral analysis or identification of substances or the measurement of molecules or other items labeled with fluorophores.

Acquiring these multiple images can be difficult since most commercially available sensor arrays are designed to capture one image at a time. Traditionally, multiple images were acquired simply by time multiplexing (e.g., capturing images one after another in time) or by using two or more imaging systems or detector arrays in parallel.

For example, spectral imaging applications may use a single image camera in connection with a filter wheel. The filter wheel contains wavelength filters that correspond to the wavelength bands of interest. At any one time, only one of the wavelength filters is positioned in the imaging path and the camera captures the filtered image. The filter wheel rotates in order to switch from one wavelength filter to the next, with the camera capturing images one after another. Thus, the multispectral imaging is implemented in a time multiplexed manner. However, the resulting systems can be large and complicated.

An alternate approach is based on dispersive elements such as prisms or gratings. In this approach, dispersive elements are used to spatially separate different wavelengths. The light is typically dispersed along one dimension of the detector array. The other dimension is used to capture one spatial dimension of the object. However, it is difficult to also capture the second spatial dimension of the object. Sometimes, time multiplexing is introduced to capture the second spatial dimension, for example by scanning.

Yet another approach is to use multiple cameras or imaging systems in parallel. Each camera is fitted with a different spectral filter and the bank of cameras capture filtered images simultaneously. However, this increases the overall cost and complexity since the amount of hardware required is significantly increased. In addition, bulky camera systems may introduce parallax problems.

For some applications, it may be possible to attach filters individually to each sensor element. For example, a conventional RGB imaging device may be based on a detector array where red, green and blue filters are attached to each individual detector. The Bayer pattern is one common pattern for arranging these micro-filters on the detector array. However, one disadvantage of this approach is the increased cost and complexity of manufacturing. Because there is a one-to-one correspondence between micro-filters and detectors, and because the micro-filters are attached to the detectors, the micro-filters are the same size as the detectors, which is small. The many different small micro-filters must then be arranged into an array and aligned with the underlying detectors. This may be difficult, especially if a large number of different types of micro-filters are required. Another disadvantage is the lack of flexibility. Once the micro-filter array is attached to the detector array, it is difficult to change the micro-filter array.

Thus, there is a need for better multi-imaging systems, including multispectral and polarization imaging systems, including approaches to design these systems.

SUMMARY OF THE INVENTION

The present invention overcomes the limitations of the prior art by providing a computer-implemented method for designing filter modules used in multi-imaging systems.

In one aspect, an "aperture-multiplexed" imaging system includes a sensor that captures multiplexed images of an object. The filter module is positioned approximately in a conjugate plane to the sensor to provide aperture coding of the multiplexed images. The aperture-multiplexed imaging system performs a predefined task. The filter module is designed as follows. A model of the object(s) to be imaged by the imaging system is received. A candidate design for the filter module is also received. The candidate design includes a candidate spatial partition of the filter module into filter cells. The multiplexed image formation by the imaging system is simulated. A performance metric is calculated. The performance metric is a function of the simulated multiplexed images and is selected to be indicative of the predefined task. The candidate spatial partition of filter cells is modified based on the calculated performance metric.

Other aspects include different geometries for the spatial partition of the filter module, and different performance metrics depending on the desired task. In one design approach, crosstalk between different filter cells is reduced, for example reduced spectral crosstalk if the filter cells are wavelength filters.

Other aspects of the invention include devices and systems for implementing these methods, as well as devices and systems designed using these methods.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The invention has other advantages and features which will be more readily apparent from the following detailed description of the invention and the appended claims, when taken in conjunction with the accompanying drawings, in which:

FIGS. 5A-5C illustrate different arrangements of red, green and blue filter cells in a filter module.

FIGS. 9A-9C and 10A-10C show intensity distributions at different points in the imaging system, for a filter module using a RBG annular configuration.

The figures depict embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

System Overview.

Figure 1A:
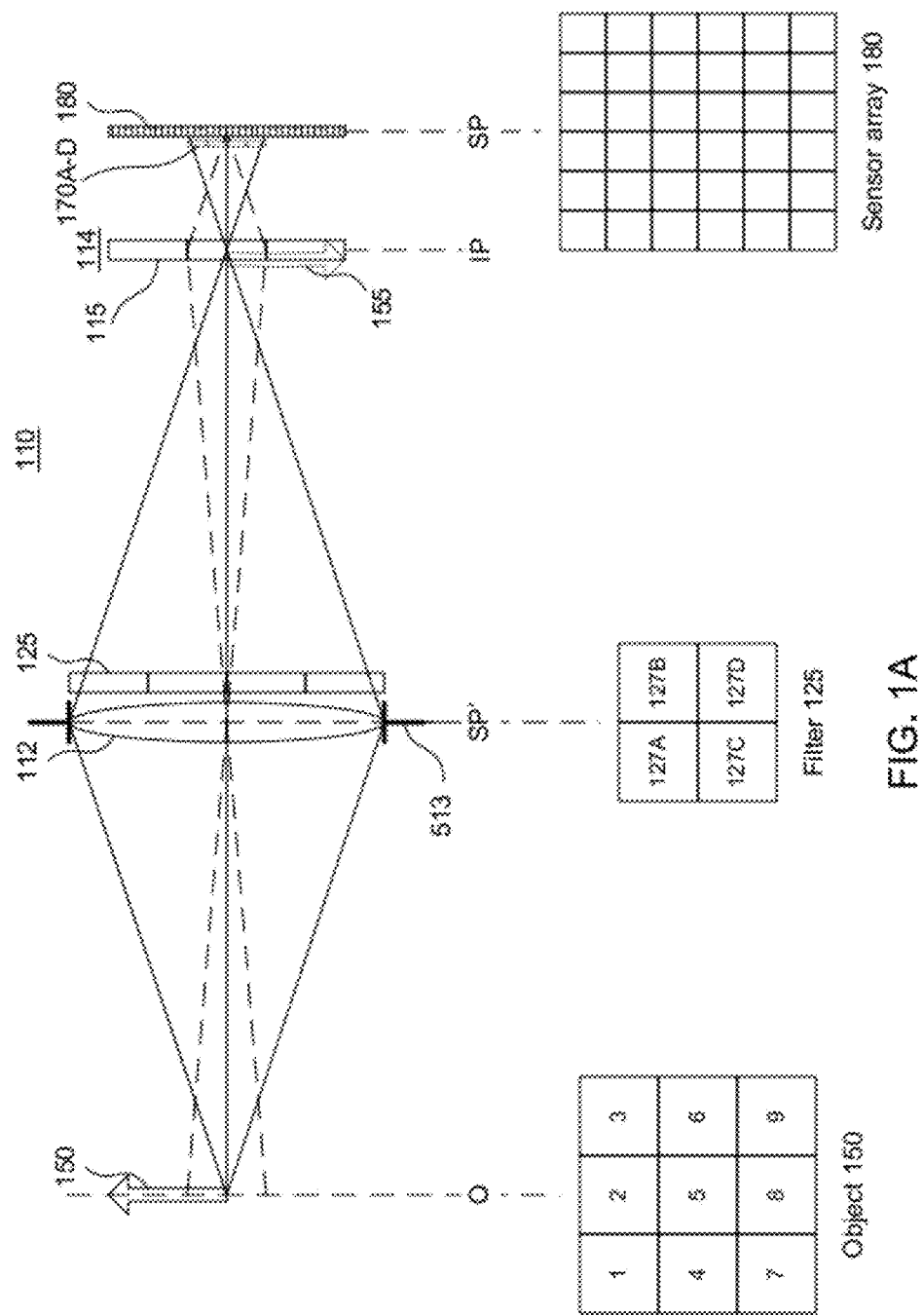
FIGS. 1A and 1B are diagrams illustrating an example aperture-multiplexed imaging system according to the invention.
Figure 1B:
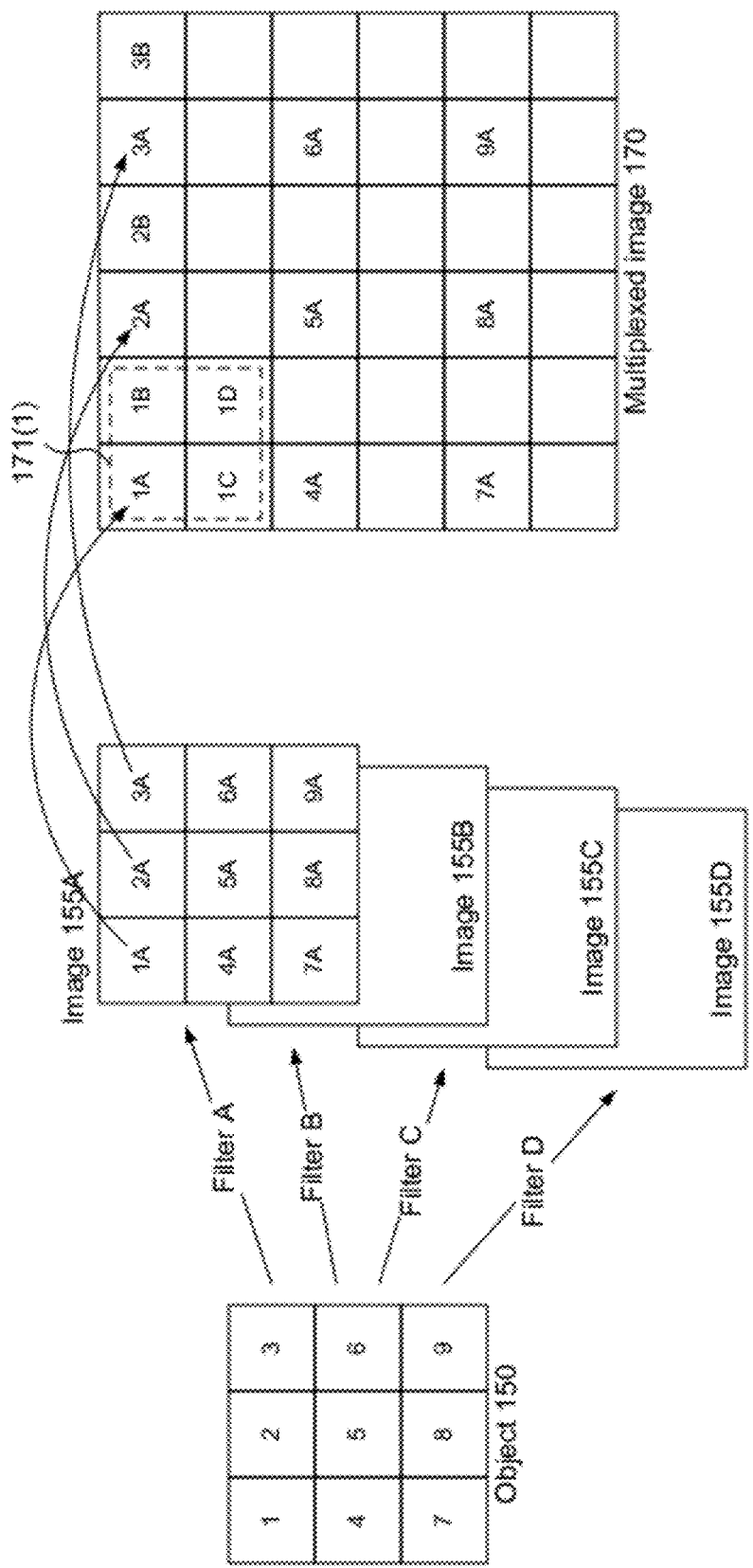

FIGS. 1A and 1B are diagrams illustrating an example aperture-multiplexed imaging system 110 according to the invention. The term "aperture-multiplexed" will be explained below. The system 110 includes an optical imaging group 112 and an array 114 of imaging-forming elements 115. The array 114 may be referred to as a microimaging array. For convenience, the optical imaging group 112 is depicted in FIG. 1A as a single objective lens, but it should be understood that it could contain multiple elements. The objective lens 112 forms an optical image 155 of the object 150 at an image plane IP. The microimaging array 114 is located at the image plane IP. The system in its entirety forms spatially multiplexed and interleaved optical images 170 at the sensor plane SP. Examples of microimaging arrays 114 include microlens arrays, arrays of pinholes, micromirror arrays, checkerboard grids and waveguide/channel arrays. The sensor array 180 is also shown in FIG. 1A.

A filter module 125 is positioned at a plane SP' conjugate to the sensor plane SP. The actual physical location may be before, after or in the middle of the optical imaging group 112. The filter module contains a number of spatially multiplexed filter cells 127A-D. In this example, the filter module 125 includes a rectangular array of filter cells 127, as shown in the bottom portion of FIG. 1A.

The bottom portion of FIG. 1A provides more detail. In this diagram, the object 150 is divided into a 3×3 array of regions, which are labeled 1-9. The filter module 125 is a 2×2 rectangular array of individual filter cells 127A-D. For example, each filter cell 127A-D might have a different spectral response. The sensor array 180 is shown as a 6×6 rectangular array.

FIG. 1B illustrates conceptually how the spatially multiplexed optical images 170A-D are produced and interleaved at sensor array 180. The object 150, if captured and filtered by filter cell 127A, would produce an optical image 155A. To distinguish optical image 155A from an unfiltered image of the object, the 3×3 regions are labeled with the suffix A: 1A-9A. Similarly, the object 150 filtered by filter cells 127B, C,D, would produce corresponding optical images 155B,C,D with 3×3 regions labeled 1B-9B, 1C-9C and 1D-9D. Each of these four optical images 155A-D is filtered by a different filter cell 127A-D within filter module 125 but they are all produced simultaneously by the imaging system 110.

The four optical images 155A-D are formed in an interleaved fashion at the sensor plane, as shown in FIG. 1B. Using image 155A as an example, the 3×3 regions 1A-9A from optical image 155A are not contiguous in a 3×3 block within optical image 170. Rather, regions 1A, 1B, 1C and 1D, from the four different optical images, are arranged in a 2×2 fashion in the upper left of optical image 170 (the inversion of image 170 is neglected for clarity). Regions 2-9 are similarly arranged. Thus, the regions 1A-9A that make up optical image 170A are spread out across the composite optical image 170, separated by portions of the other optical images 170B-D. Put in another way, if the sensor is a rectangular array of individual sensor elements, the overall array can be divided into rectangular subarrays 171(1)-(9) of sensor elements (only one subarray 171(1) is shown in FIG. 1B). For each region 1-9, all of the corresponding regions from each filtered image are imaged onto the subarray. For example, regions 1A, 1B, 1C and 1D are all imaged onto subarray 171(1). Note that since the filter module 125 and sensor assembly 180 are located in conjugate planes, each imaging element 115 in array 114 forms an image of the filter module 125 at the sensor plane SP. Since there are multiple imaging elements 115, multiple images 171 of the filter module 125 are formed.

It should be noted that FIG. 1 has been simplified to illustrate underlying concepts. For example, the object 150 was artificially divided into an array in order to more easily explain the overall imaging function. The invention is not limited to arrayed objects. As another example, most practical systems will use significantly larger arrays, particularly at the sensor assembly and possibly also at the filter module. In addition, there need not be a 1:1 relationship between the 6×6 regions at the sensor plane and the underlying sensor elements in the sensor array. Each region could correspond to multiple sensor elements, for example. As a final example, the regions labeled 1 in the object, 1A in the filtered image 155A and 1A in the composite image 170 do not have to be exact images of each other. In some designs, region 1A within image 170 may capture the filtered energy approximately from region 1 in the object 150, but it may not actually be an image of region 1. Thus, the energy collected by sensor elements in region 1A of image 170 may be integrating and sampling the image (or some transformation of the image) in region 1 in object 150, rather than representing a geometrical reproduction of the object at that region. In addition, effects such as parallax, vignetting, diffraction and optical propagation may affect any image formation.

The approach shown in FIG. 1 has several advantages. First, multiple optical images 170A-D are captured simultaneously at the sensor plane. Second, each captured image is filtered by a filter cell 127A-D within filter module 125, and each filter cell 127 may be designed to implement different filtering functions. Furthermore, since the filter module 125 is located at a conjugate plane SP' rather than the actual sensor plane SP, and since this typically means that the filter module will be much larger compared to what would be required at the sensor plane, the tolerances and other mechanical requirements are relaxed. This makes it easier to manipulate the filter module, compared to if the filter module were located at the sensor plane (e.g., if attached to the sensor assembly).

Design Approach Overview.

The term "aperture-multiplexed" refers to the fact that multiple images 170 are spatially multiplexed at the sensor 180 (in an interleaved fashion), and that each image 170 is filtered by a different filter cell 127A-D but the filtering is applied at the conjugate sensor plane (i.e., at the aperture) not at the actual sensor plane. Thus, system 110 is an "aperture-multiplexed" imaging system. The filtering which occurs at the aperture plane will sometimes be referred to as aperture coding.

One drawback of aperture coding is that the conjugate plane SP' typically will not be perfectly imaged onto the sensor plane SP. Effects such as distortion, parallax and aberrations (both geometric and chromatic) may cause crosstalk between adjacent multiplexed images at the sensor plane. Referring to FIG. 1B, imperfect imaging may cause images 1A and 1B to blend together, at least at the boundaries. The net effect is that the blended image captured by the sensors 180 no longer represents the object filtered by only filter A or by only filter B, but as filtered by some combination of filters A and B. This crosstalk between filters A and B is usually undesirable.

Figure 2:
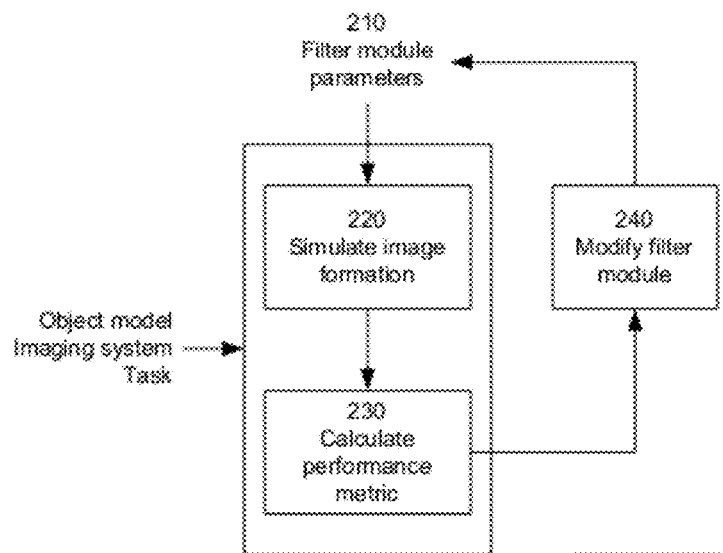
FIG. 2 is a flow diagram for an example method to design aperture-multiplexed imaging systems, according to the invention.

Thus it is desirable to account for the properties of the system when designing the filter module. FIG. 2 is a flow diagram for a method to design aperture-multiplexed imaging systems, which accounts for these system properties. In this approach, the description 210 of the filter module has two parts: a spatial partition of the filter module into individual filter cells, and the optical properties (e.g., a specific spectral filter response or polarization filter response) of each filter cell. The purpose of the method in FIG. 2 is to design the spatial partition and possibly also the individual optical properties.

Given a candidate design for the filter module 210, a computer system simulates 220 the overall image formation by the imaging system. This typically will include modeling the propagation through all of the optics, the detector behavior and subsequent processing. The modeling should be accurate enough to predict crosstalk between different filter cells. The resulting simulated images are used to calculate 230 a performance metric. The performance metric is selected according to the desired task for the imaging system. Steps 220 and 230 typically will also use models of the object(s) to be imaged, a description of the other portions of the imaging system and possibly also additional information about the task at hand. The filter module 210 is modified 240 based on the calculated performance metric. Repeating this cycle improves the design for the filter module.

Figure 3A:
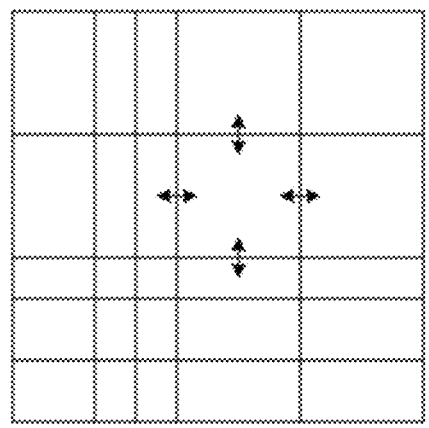
FIGS. 3A-3G and 4A-4B illustrate different spatial partitions for the filter module.

FIGS. 3A-4B illustrate various types of partitions and parameterizations. In FIG. 3A, the filter module is partitioned into an array of rectangular filter cells, which are defined by their boundaries. The partition can be modified by moving the boundaries, as indicated by the arrows in the figure. For clarity, only a few arrows are shown in the figure. Note that the filter cells are all rectangular, but they need not be the same size. In FIG. 3B, the filter module is partitioned into a concentric array of circular annular filter cells. This partition is also defined by the boundaries between filter cells. The boundaries are circles in this case. FIG. 3C is a variation where the filter cells are square annular filter cells. In FIG. 3D, the filter module is partitioned into a polar array of sector-shaped filter cells, again defined by the boundaries between filter cells. The outside border is shown as rectangular, but it could also be other shapes (e.g., circular). In one variation, the position of the origin can also be changed. FIG. 3E shows a sector-based partition, where the origin is offset from the center of the filter module. FIG. 3F combines annular and sector boundaries, producing filter cells that have an annular sector shape. The annular boundaries and/or the sector boundaries can be modified. FIG. 3G is similar, except that the sector boundaries can move independently for each annulus.

Figure 3B:
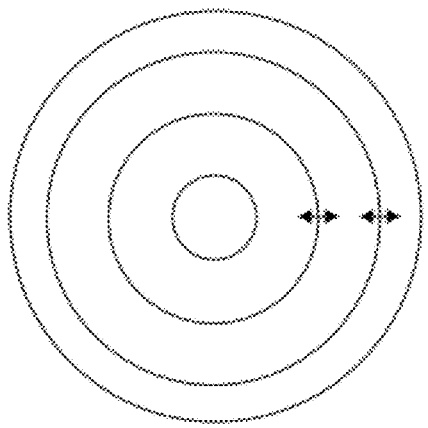
Figure 3C:
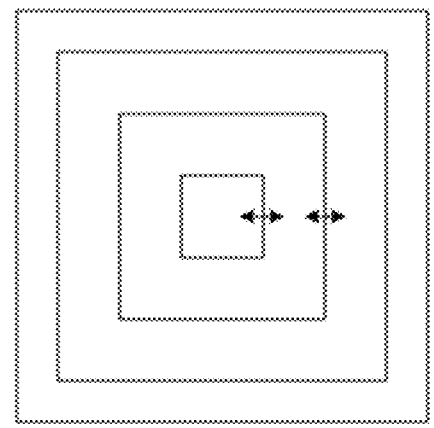
Figure 3D:
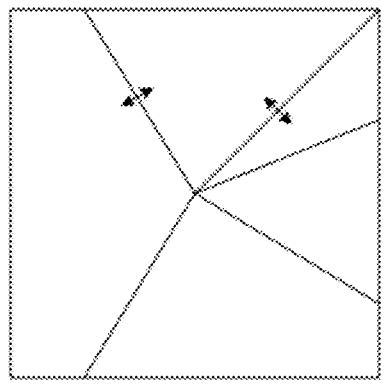
Figure 3E:
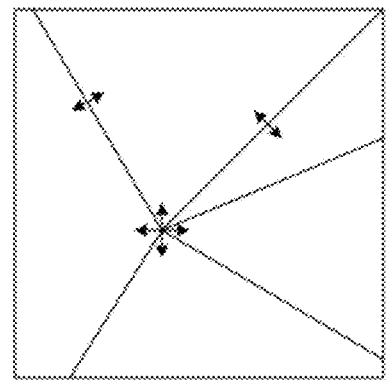
Figure 3F:
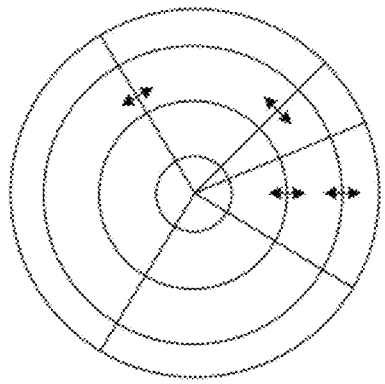
Figure 3G:
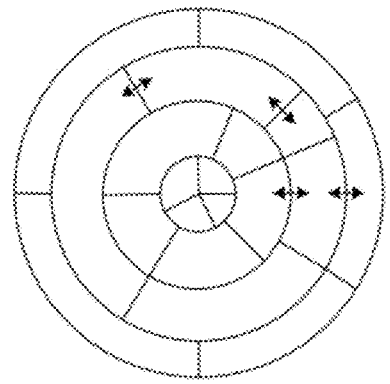
Figure 4A:
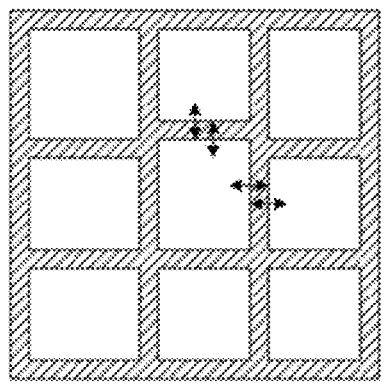
Figure 4B:
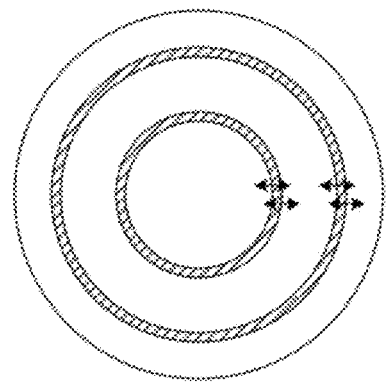

FIGS. 3A-3G are all examples where the spatial partition is modified by moving boundaries between filter cells. This assumes that adjacent filter cells butt up against each other. This is not required. FIG. 4A shows a partition of rectangular filter cells, where the boundary of each filter cell can be adjusted separately from the boundary of the adjacent filter cell. This can be used to create dead space or guard bands between filter cells, shown as the cross-hatched area in FIG. 4A. Dead zones can be used beneficially to reduce crosstalk at the sensor. FIG. 4B is a similar example using annular filter cells.

The spatial partition of the filter module into filter cells can also be parameterized in other ways. For example, the parameterization can be designed to permit modification of the position and/or size of filter cells within the filter module. Global modifications can also be made, for example scaling the entire filter module. The number of filter cells can also be variable.

In some cases, the optical properties for the filter cells may be determined a priori, in which case determining the spatial partition is the primary task in designing the filter module. An example might be if a certain spectral response is desired (e.g., detecting R, G and B components of an object, where the different components are defined by an industry standard). In other cases, the optical properties for the filter cells may be iterated in addition to the spatial partitioning. The same is true for the rest of the imaging system. That is, in some cases, the rest of the imaging system (or certain components within the imaging system) may also be iterated based on the performance metric.

As illustrated above, the individual filter cells can have different shapes and sizes: rectangles, disk segments, rings, ring segments. Which one to choose depends in part on the application requirements. For example, an aperture mask coded with annuli has some advantages for extended depth of focus requirements. A partition into squares has some advantages in applications that require a compact point spread function at the microimaging array 114 to keep crosstalk between adjacent imaging elements to a minimum.

Light Propagation.

This section describes a specific implementation of part of step 220 in FIG. 2, specifically modeling the propagation of light to the sensor. Referring to FIG. 1A, the main lens system 112 has focal length F and diameter D. The microimaging array 114 is a microlens array, where each microlens has focal length f and diameter d. The distance from main lens 112 to microimaging array 114 is $z_1$ and the distance between microlens array 114 and sensor 180 is $z_2$. The coordinates in the aperture plane SP' are denoted by u, v, those in the microlens plane IP by x, y, and those in the sensor plane SP by η, ξ.

The filter module is described by a partition P of the filter module into a set of non-overlapping filter cells. Each cell $c_i$, i=1, ..., M has a spectral response function $\rho_i(\lambda)$ where $\lambda$ is the wavelength parameter.

First we model light passing through those filter cells in the filter module that have a spectral response $\rho^*$. This can be modeled by defining an aperture code mask, which is a binary function and transmits light only through those cells that have spectral response $\rho^*$. This mask is given by the following aperture transmission function $$t_{\rho^*}(u, v, \lambda) = \qquad (1)$$
$$\begin{cases} \rho^*(\lambda), & \text{if } \exists\, i \in \{1, \ldots, M\} \text{ such that } (u, v) \in c_i \in P \text{ with } \rho^* = \rho_i, \\ 0, & \text{otherwise} \end{cases}$$

where u, v are the spatial coordinates in the aperture plane. The wavefront passing through the main lens and the microlens onto the sensor is denoted by $U_{sensor}\{t_\rho\}$. The wavefront that passes through the main lens onto the microlens plane (MLA plane) is denoted by $U_{MLA}\{t_\rho\}$.

Crosstalk at the MLA plane can be characterized as follows. The light passing through the main lens should ideally come to focus at the MLA plane. Due to lens aberrations and chromatic aberrations, that ideal case may not be achieved. Point spread functions (PSFs) for some wavelengths may have a larger width than PSFs for other wavelength and can leak over to other microlenses, causing crosstalk at the MLA plane. The throughput of PSF energy transmitted by the on-axis microlens incident on the sensor is computed as $$Q_{MLA}(\rho_i) = \frac{\iiint U_{sensor}\{t_{\rho_i}\}(\eta, \xi, \lambda) d\eta d\xi d\lambda}{\iiint U_{MLA}\{t_{\rho_i}\}(x, y, \lambda) dx dy d\lambda}. \quad (2)$$

Spectral crosstalk at the sensor can then be characterized as follows. The image of the aperture mask on the sensor is not simply the same image scaled by the magnification factor of the microlens. Chromatic aberration, diffraction effects, and lens aberrations are distorting the image causing non-overlapping cells in the aperture mask to overlap in the sensor image. Such overlap causes spectral cross-talk at the sensor plane. Therefore, not an entire cell area, but a reduced one may contain the object's spectral information intended to be filtered. In order to measure the performance of the system, we measure the spectral information on the sensor inside a superpixel S that is not affected by cross-talk. To achieve that goal, we first define the overlapping regions between two cell images on the sensor as $$\Delta_1 = \bigcup_{(i,j), i \neq j} \left\{ \{(\eta, \xi) \in S \mid \int U_{sensor}\{t_{\rho_i}\}(\eta, \xi, \lambda) d\lambda \neq 0 \} \cap \right.$$
$$\left. \{(\eta, \xi) \in S \mid \int U_{sensor}\{t_{\rho_j}\}(\eta, \xi, \lambda) d\lambda \neq 0 \} \right\} \quad (3)$$

The set of wasted pixels is described by $$\Delta_2 = S \setminus \bigcup_i \{(\eta, \xi) \in S \mid \int U_{sensor}\{t_{\rho_i}\}(\eta, \xi, \lambda) d\lambda \neq 0\}, \quad (4)$$

where S is the set containing all pixels inside a superpixel of diameter d. Evaluating the areas of $\Delta_1$ and $\Delta_2$ gives us a measure for how many pixels exposed to light passing through only a single filter response are in a superpixel.

For a given application it may be desired to capture spectral information according to a specific distribution over the filters. For example, the Bayer pattern contains twice as many green filters compared to red and blue since it is matching specific characteristics of the human visual system. For other applications, such as a detection or classification task, one might want to have a different distribution, e.g. higher response in blue than red due to required discriminating power between signals in the blue and red region of the light spectrum.

As a general model, we assume a target distribution given by discrete values of $\alpha_m$, $m=1,\ldots M$ with $0 < \alpha_m \leq 1$ and $\Sigma \alpha_m = 1$ for M spectral filters with responses $\rho_1, \ldots \rho_M$. The light collected at location $(\eta, \xi)$ on the sensor is described by $$J_{sensor}(\rho_m)(\eta, \xi) = \int U_{sensor}\{t_{\rho_m}\}(\lambda, \eta, \xi) \tau(\lambda) d\lambda, \quad (5)$$

where $\tau(\lambda)$ is the spectral sensitivity of the detector. The final spectral information computed from the sensor measurements for the on-axis spatial location is $$I(\rho_m) = \int_{S \setminus \Delta_1} J_{sensor}(\rho_m) d\mu \quad (6)$$

with $\mu$ being an integration measure. In one example, $\mu$ is the Lebesgue measure. In order to match the target distribution $\{\alpha_m\}$, the information collected at the sensor should satisfy $$\frac{I(\rho_m)}{\sum_n I(\rho_n)} \approx \alpha_m. \quad (7)$$

The difference between the distribution of captured spectral information and the target distribution is measure by a distance metric $$dist\left(\frac{I(\rho_m)}{\sum_n I(\rho_n)}, \alpha_m\right).$$

Geometric Optics. Using ray transfer matrices we can derive an approximation of the propagation U using geometric optics. A light ray enters the system when the ray crosses the input plane at a distance $x_1$ from the optical axis while traveling in a direction that makes an angle $\theta_1$ with the optical axis. Some distance further along, the ray crosses the output plane, this time at a distance $x_2$ from the optical axis and making an angle $\theta_2$. These quantities are related by the expression $$\begin{pmatrix} x_2 \\ \theta_2 \end{pmatrix} = \begin{pmatrix} A & B \\ C & D \end{pmatrix} \begin{pmatrix} x_1 \\ \theta_1 \end{pmatrix} \quad (8)$$

Using a thin lens approximation, we can define the ray transfer matrix for this example system as $$U = S(z_2) L(f_\lambda) S(z_1) L(F\lambda) \quad (9)$$
$$= \begin{pmatrix} \left(1 - \frac{z_2}{f_\lambda}\right)\left(1 - \frac{z_1}{f_\lambda}\right) - \frac{z_2}{F_\lambda} & z_1\left(1 - \frac{z_2}{f_\lambda}\right) + z_2 - \\ \frac{1}{f_\lambda} + \frac{z_1}{f_\lambda \cdot F_\lambda} - \frac{1}{F_\lambda} & \frac{z_1}{f_\lambda} + 1 \end{pmatrix}.$$

The focal length of a lens depends on the wavelength of the light passing through the lens. Typically lens specifications give the focal length as one number with respect to a reference wavelength. For other wavelengths, the focal properties differ a little, causing chromatic aberrations at the image plane. That means the ray transfer matrix U depends on $\lambda$ as $f_\lambda$ and $F_\lambda$ depend on $\lambda$.

Depending on the diameter of the main lens D and the focal length F for a specific reference wavelength, not all of the rays passing through the main lens at that wavelength may hit the microlens. Since the ray transfer matrix for the main lens system is given by $$S(z_1)L(F_\lambda) = \begin{pmatrix} 1 - \frac{z_1}{F_\lambda} & z_1 \\ -\frac{1}{F_\lambda} & 1 \end{pmatrix}, \quad (10)$$

only rays from a planar wave hitting the main lens inside a disc of radius $$R_{M,geom} = d \cdot \left(1 - \frac{z_1}{F_\lambda}\right)^{-1} \quad (11)$$

will hit the microlens of diameter d.

Given this geometric model, we can specify the spectral crosstalk at the sensor in terms of overlapping and wasted regions by substituting U from Eqn. (9) for $U_{sensor}$ in Eqns. (3) and (4):

$$\Delta_{0,g}\{t_{\rho_i}\} = \left\{(\eta, \xi) \in S \;\middle|\; \int U\{t_{\rho_i}\}(\eta, \xi, \lambda) d\lambda \neq 0\right\} \quad (12)$$

$$\Delta_{1,g} = \bigcup_{(i,j), i \neq j} \left\{\left\{(\eta, \xi) \in S \;\middle|\; \int U\{t_{\rho_i}\}(\eta, \xi, \lambda) d\lambda \neq 0\right\} \cap \right.$$

$$\left. \left\{(\eta, \xi) \;\middle|\; \int U\{t_{\rho_j}\}(\eta, \xi, \lambda) d\lambda \neq 0\right\}\right\}$$

$$\Delta_{2,g} = S \setminus \bigcup_i \left\{(\eta, \xi) \in S \;\middle|\; \int U\{t_{\rho_i}\}(\eta, \xi, \lambda) d\lambda \neq 0\right\}. \quad (13)$$

Bayer Filtering Example. Now consider a system designed to perform Bayer filtering, where the filter module is partitioned as shown in FIG. 3B. The partition consists of three filter cells $c_1$, $c_2$, $c_3$ forming rings with inner and outer radii $r_{i,1}, r_{o,1}, r_{i,2}, r_{o,2}, r_{i,3}, r_{o,3}$ with $r_{i,1}=0$, $r_{o,1}=r_{i,2}$ and $r_{o,2}=r_{i,3}$. The spectral responses for the filter cells are $\rho_1$, $\rho_2$, $\rho_3$, respectively, each characterized by a center wavelength $\lambda_1$, $\lambda_2$, $\lambda_3$. For each center wavelength $\lambda_i$, we can compute the focal lengths $f_i$ and $F_i$ of microlens and main lens.

For a reference wavelength $\lambda_i$ and a planar incoming wave, the spatial extent of a disc of radius r imaged onto the sensor is given by $$\left(\left(1 - \frac{z_2}{f_i}\right)\left(1 - \frac{z_1}{F_i}\right) - \frac{z_2}{F_i}\right) \cdot r.$$

From the images of the ring radii for corresponding center wavelengths we can compute the overlap and wasted area between imaged rings.

FIGS. 5A-5C show three possible arrangements of red, green and blue filters within the filter module. In FIG. 5A, the blue filter is in the center. FIGS. 5B and 5C are the two possible configurations where the red filter is in the center. These configurations will be referred to as BGR, RGB, and RBG, respectively. The filter cells are sized so that the G filter cell has twice the area of either the R or B filter cell, consistent with a standard Bayer configuration. The center wavelengths are chosen as $\lambda_B$=450, $\lambda_G$=550, $\lambda_R$=650. We set $z_1$=50 mm and $z_2$=1.625 mm, which is equal to the focal lengths F and f of the main lens and microlens, respectively, at reference wavelength $\lambda$=588. The lens diameter ratio d/D=0.0325.

For these numbers, we use geometric optics to simulate the imaging of each filter cell by the microlens onto the sensor. Table 1 shows the radii of the image of each filter cell.

TABLE 1

Radius of the images of the filter cells of FIG. 5.

|  | BGR | RGB | RBG |
|---|---|---|---|
| $r_{o,1}$ | 0.0164 | 0.0162 | 0.0162 |
| $r_{i,2}$ | 0.0163 | 0.0163 | 0.0164 |
| $r_{o,2}$ | 0.0282 | 0.0282 | 0.0232 |
| $r_{i,3}$ | 0.0280 | 0.0284 | 0.0230 |
| $r_{o,3}$ | 0.0323 | 0.0328 | 0.0326 |

The BGR column shows the results for the BGR configuration (shown in FIG. 5A). As shown in Table 1, the center blue filter is imaged to a disk with $r_{o,1}$=0.0164. The middle annular green filter is image to an annulus with inner radius $r_{i,2}$=0.0163 and outer radius $r_{o,2}$=0.0282. Note that the images of the blue filter and the green filter overlap, since the image of the blue filter ends at $r_{o,1}$=0.0164 but the image of the green filter starts at $r_{i,2}$=0.0163. Similarly, the images of the green filter and red filter also overlap for the BGR configuration. For the other two configurations, there are either dead zones or overlaps at the filter cell boundaries.

We now ask the question of given a constraint on the area coverage of 1:2:1 for blue, green, and red filters, which configuration produces the least amount of dead and overlapping areas in the superpixel. We would also like to account for the accuracy of the 1:2:1 area coverage condition. One cost function that does this is $$C_{Bayer} = \max_{m=1,2,3} \left| \alpha_m^{-1} \cdot \frac{\text{area}(\Delta_{0,g}\{t_{pm}\}) \setminus [\Delta_{1,g} \cup \Delta_{2,g}])}{\sum_m \text{area}(\Delta_{0,g\{t_{pm}\}} \setminus [\Delta_{1,g} \cup \Delta_{2,g}])} - 1 \right|. \quad (14)$$

The values of $C_{Bayer}$ for $\alpha_1$=0.25, $\alpha_2$=0.5, and $\alpha_3$=0.25 are displayed in Table 2. Each column is a different ordering of the red, green and blue filter cells.

TABLE 2

Cost functions for different orderings of filter cells

|  | BGR | RGB | GRB | GBR | BRG | RBG |
|---|---|---|---|---|---|---|
| area($\Delta_{1,g}$) in $10^{-4} \mu^{-2} d^2/D^2$ | 0.1050 | 0.1316 | 0.2159 | 0.1646 | 0.0843 | 0.0720 |
| area($\Delta_{2,g}$) in $10^{-4} \mu^{-2} d^2/D^2$ | 0.1563 | 0.1814 | 0.2657 | 0.2159 | 0.1354 | 0.1231 |
| $C_{bayer}$ | 0.0338 | 0.0936 | 0.0785 | 0.0576 | 0.0168 | 0.0134 |

Here, we see that the two layouts BRG and RBG have the least amount of non-usable pixels on the sensor and preserve the target distribution of 1:2:1 best from among the six different layouts. Note that in this example all rays entering the main lens parallel to the optical axis hit the microlens. This does not have to be true in general. For lenses with high chromatic aberration or for small microlenses, for different wavelengths of light there will be an increased variation in the focal lengths, increasing the possibility of rays exiting the lens and not hitting the microlens.

Wave Aberration Optics. In order include diffraction effects and lens aberrations into the wave propagation computations to describe the wavefront passing through the aperture and the microlens onto the sensor, we approximate the diffraction integral by the Fresnel approximation using the operator notation introduced in J. W. Goodman, *Introduction to Fourier Optics*, McGraw-Hill, New York, 1986. The planar wave passing through a lens with focal length F and aperture transmission function $t_{p*}$ is given by $$Q\left[-\frac{1}{F}\right]\{t_{p*}\}, \qquad (15)$$

where $Q[c]\{U(x)\} = \exp^{j\frac{k}{2}cx^2} U(x)$.

Free space propagation of a wavefront U over a distance z is given by $$R[z]\{U(x_1)\} = \frac{1}{\sqrt{j\lambda z}} \int U(x_1) \exp^{j\frac{k}{2}(x_2-x_1)^2} dx_1. \qquad (16)$$

For this example lens system, the propagation of a planar wavefront to the sensor is therefore given by $$U_{sensor}\{t_{p*}\} = R[z_2]Q\left[-\frac{1}{f}\right]\{t_d\}R[z_1]Q\left[-\frac{1}{F}\right]\{t_{p*}\}, \qquad (17)$$

where $t_d$ is the aperture transmission function for a clear aperture of diameter d. This propagation assumes an incoming planar wave which models the case of light coming from an on-axis point source propagating to a main lens with telecentric stop at the insertion plane of the filter mask. Generalizations include propagating light from off-axis object points and through non-telecentric main lens systems.

The quantities $\Delta_1$, $\Delta_2$, and $I(\rho_m)$ from above can be computed using this expression of $U_{sensor}$ for the wave propagation introduced in Eqn. (2).

Figure 6A:
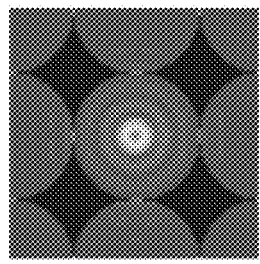
FIGS. 6A-6C, 7A-7C and 8A-8C show intensity distributions at different points in the imaging system, for a filter module using a BGR annular configuration.
Figure 6B:
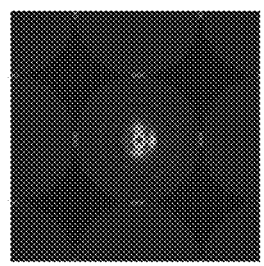
Figure 6C:
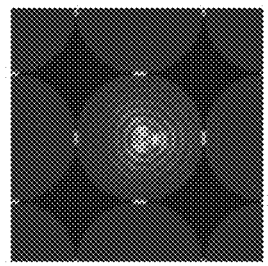
Figure 7A:
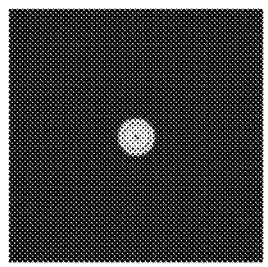
Figure 7B:
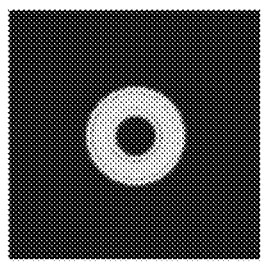
Figure 7C:
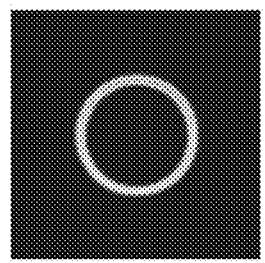
Figure 8A:
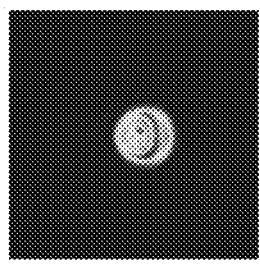
Figure 8B:
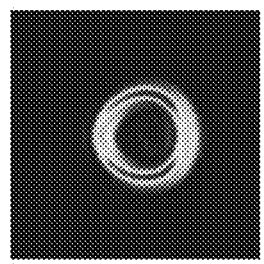
Figure 8C:
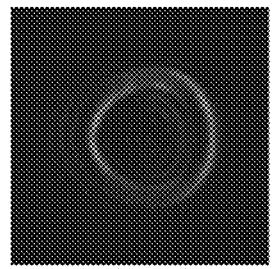

FIGS. 6A-6C shows PSF crosstalk at the MLA plane for an aberrated main lens with OPD-RMS=0.01. The filter module uses the BGR configuration for the filter module (FIG. 5A). The main lens diameter D=4 cm, microlens diameter $D_{MLA}$=130 micron and $z_1$=50 mm and $z_2$=1.650 mm. FIG. 6A shows the intensity distribution at the MLA plane, produced by light travelling through the blue filter cell (which is also assumed to have blue wavelength). FIGS. 6B and 6C show the intensity distributions at the MLA plane, produced by light travelling through the green and red filter cells, respectively. FIGS. 7A-7C show this same light but propagated to the sensor plane, assuming a non-aberrated microlens. FIG. 7A shows the light distribution at the sensor plane, produced by light travelling through the blue filter cell. Similarly, FIGS. 7B and 7C show the light distribution at the sensor plane, produced by light travelling through the green and red filter cells, respectively. FIGS. 8A-8C are the same as FIGS. 7A-7C, but assuming an aberrated microlens with OPD-RMS=0.05. Diffraction effects are visible. Note that the color in FIGS. 6-8 is pseudocolor used to show relative intensity, not wavelength.

FIGS. 9 and 10 are analogous figures, but using the RBG configuration (FIG. 5C). FIGS. 9A-9C correspond to FIGS. 6A-6C and show the light distribution at the MLA plane for an aberrated main lens with OPD-RMS=0.01. FIG. 9A is for the blue filter, FIG. 9B is for the green filter and FIG. 9C is for the red filter. The wavelengths are presented in the same order as in FIGS. 6-8 to facilitate comparison, even though the order of the filter cells in the filter module is different. FIGS. 10A-10C correspond to FIGS. 8A-8C, and show the light distribution at the sensor plane, assuming an aberrated microlens with OPD-RMS=0.05. The case with the non-aberrated microlens is not presented here. Similar to the geometric case, where the RBG pattern outperformed the BGR pattern, placing the green filter at the outside and the red inside results in less crosstalk at the sensor.

More about Optimization.

The design of the spatial partition for the filter module can be formulated as an optimization problem: optimize the parameters of the filter cells forming the spatial partition, given a specific performance metric. Consider the partition of FIG. 3G as an example. Each of the filter cells is a ring segment. A ring segment is defined by an inner radius $r_0$, a width $\delta$ (so that the outer radius is $r_0+\delta$), an angular offset $\phi_0$ and an angular span $\phi$ (so that the ring segment extends from $\phi_0$ to $\phi_0+\phi$). The partition $P_R$ divides the disk into N nested rings $R_n$. Each ring $R_n$ is divided into M(n) ring segments $c_{n,m}$ parameterized by $r_{0,n,m}$, $\delta_n$, $\phi_{n,m}$, an $\phi_{0,n,m}$. Each ring segment (i.e., filter cell) has a spectral response function $\rho_{n,m}(\lambda)$. In the case of the partition $P_R$, we want to determine the optimal widths of the rings and the optimal angular spans of the ring segments according to minimizing an application specific cost function C. To answer this question we set up the following constrained optimization problem:

Minimize $C(x)$ (18)

subject to $g(x) \leq 0$ $h(x) \leq 0$ with optimization variable $x \in \mathbb{R}^{N+2\Sigma_{n=1}^{N}(M(n))}$, with $x_i = \delta_i$, $i=1, \ldots, n$, $x_i = \phi_{n,m}$, $i=N+(n-1)\cdot M(n-1)$, $$x_i = \phi_{0,n,m}, \; i = N + \sum_{n=1}^{N}(M(n)) + (n-1)\cdot M(n-1),$$

for n=1, ..., N, m=1, ..., M(n),
with g being a linear constraint function, and h being a non-linear constraints function that may be used to compute, for example, lower bounds on cell areas.

In the case of the partition $P_R$, the linear constraints may look like $$\sum_{n=1}^{N} \delta_n = R \qquad (19)$$

$$\sum_{m=1}^{M(n)} \phi_{n,m} = 2\pi$$

$$0 \leq \delta_n \leq 1$$

$$0 \leq \phi_{n,m} \leq 2\pi$$

$$0 \leq \phi_{0,n,m} \leq 2\pi$$

$$r_{0,n} = \delta_n - r_{0,n-1}$$

For the layout of a fixed radial partition with variable offset $v=(v_1, v_2)$, the optimization problem looks like follows:

Minimize $C(P_x)$ (20)

subject to $0 \leq x_1 \leq R$ $0 \leq x_2 \leq R$ $h(x) \leq 0$ with optimization variable $x \in \mathbb{R}^2$, $x_1 = v_1$, $x_2 = v_2$.

The cost functions in these examples are designed to take into account the crosstalk at the MLA-plane as well as spectral cross-talk at the sensor and distribution of captured information over different spectral filters. Since these measures are based on the wave propagation and integration over certain areas, they are highly nonlinear and non-convex. Therefore, in general, we cannot assume the optimization problem to be convex and prefer to use solvers that apply to non-convex constraint optimization problems.

One choice for the cost function is to generalize the cost function used for the Bayer pattern evaluation applying geometric optics approximation from Eqn. (14) to the following form.

$$C_1 = \max_{m=1,\ldots,M} \left| \alpha_m^{-1} \cdot \frac{I(\rho_m)}{\sum_n I(\rho_m)} - 1 \right|, \quad (21)$$

where $\{\alpha_m\}_{m=1,\ldots,M}$ is the target distribution.

Other choices for cost functions include a weighting of the information captured at the sensor by the light throughput of the microlens:

$$C_2 = \max_{m=1,\ldots,M} |1 - Q_{MLA}(\rho_m)|, \quad (22)$$

or consideration of the amount of non-usable pixels on the sensor, measured by quantities $\Delta_1$ and $\Delta_2$:

$$C_3 = \max_{m=1,\ldots,M} \left[ w_0 \cdot \left| \frac{\alpha_m^{-1} \cdot I(\rho_m)}{\sum_n I(\rho_m)} - 1 \right| \right] +$$

$$\max_{m=1,\ldots,M} \left[ w_1 \cdot \frac{\int_{\Delta_1} J_{sensor}(\rho_m)}{\sum_n I(\rho_n)} \right] + \max_{m=1,\ldots,M} \left[ w_2 \cdot \frac{\int_{\Delta_2} J_{sensor}(\rho_m)}{\sum_n I(\rho_n)} \right]$$

An alternative cost function could be:

$$C_4 = \max_{m=1,\ldots,M} \left( \begin{array}{c} w_0 \cdot \left| \frac{\alpha_m^{-1} \cdot I(\rho_m)}{\sum_n I(\rho_m)} - 1 \right| + \\ w_1 \cdot \frac{\int_{\Delta_1} J_{sensor}(\rho_m)}{\sum_n I(\rho_n)} + w_2 \cdot \frac{\int_{\Delta_2} J_{sensor}(\rho_m)}{\sum_n I(\rho_n)} \end{array} \right) \quad (23)$$

for weights $0 \leq w_i \leq 1$ and $\Sigma_i w_i = 1$.

The optimization problem (18) includes a non-linear constraint function h. This function can calculate a lower bound on the size of a filter cell depending on the minimal resolvable spot size on the sensor and the magnification factor of the microlens. The circle of the size of the minimal resolvable spot size on the sensor, projected through the microlens onto the aperture plane is denoted as $\Delta u$.

The minimal resolvable spot size $\Delta s_\lambda$ of the microlens system is described by applying the Rayleigh criterion as:

$$\Delta s_\lambda = 1.22 \cdot \frac{f \cdot \lambda}{d} = 1.22 \cdot N_{MLA} \cdot \lambda \approx 1.22 \cdot \frac{\lambda}{2 \cdot NA_{MLA}}, \quad (24)$$

where $NA_{MLA}$ is the numerical aperture of the microlens system. As a consequence, the focal length of the microlens should be set such that the minimal resolvable spot size covers at least one sensor pixel:

$$p \leq \min \Delta s_{\lambda_j} \Leftrightarrow p \leq 1.22 \min \lambda_j \cdot N_{MLA}. \quad (25)$$

where the minimizations are over j.

Considering the magnification M of the microlens to project the minimal resolvable spot size onto the aperture plane, the resulting size $\delta u(i)$ for a filter cell $c_i$ in the filter array depends on the spectral response of the cell and satisfies $$\Delta u(i) \geq \Delta s_{\lambda_i} \cdot M. \quad (26)$$

In the case that the filter cell is an annulus of diameter d, we set the constraint function h as $$h(d_n) = -d + \gamma \cdot \Delta u(i), \quad (27)$$

where $\gamma$ is a scalar >0 that we introduce to allow to adjust the minimum filter segment size given application specifications.

In the case that the filter cell is a ring segment, the minimal segment size is approximated by the radius of the inscribed circle, i.e. the largest circle that can be drawn inside the segment, of the segment, $\min(\delta_n/2, (r_n + \delta_n/2) \sin \phi_{n,m})$, and the constraint function h is formulated as $$h(\delta_n, \phi_{n,m}) = -\min(\delta_n/2, (r_n + \delta_n/2) \sin \phi_{n,m}) + \gamma \cdot \Delta u/2, \quad (28)$$

where $\gamma \in R$ is a scalar that we introduce to allow to adjust the minimum filter segment size given applications specifications.

If the partition is parameterized as described above, the optimization problem can be solved by a constrained optimization solver. Alternately, if the partition is a collection of cells with fixed sizes but flexible spectral responses, a combinatorial optimization method such as binary search can be used.

SPECIFIC EXAMPLES

Three specific example applications are now described. The first one is the capturing of photographic information with a Bayer-pattern-type filter. In the second application, the filter module is designed for equal signal-to-noise ratios in the different captured spectral images. The third application is detecting signals in noise. All three applications use the same design parameters: main lens diameter D=40 mm, main lens focal length=50 mm, microlens diameter d=130 micron and microlens focal length=1.650 mm.

Photographic Application. We consider a filter module that uses the RBG Bayer-pattern shown in FIG. 5C. In this case, the ring segments are compete annuli (rings) and the parameter description of the partition is as follows: N=3, M (1)=M (2)=M (3)=1; $\phi_{1,1} = \phi_{2,1} = \phi_{3,1} = 2\pi$, $\phi_{0,1,1} = \phi_{0,2,1} = \phi_{0,3,1} = 0$. That means we have only two optimization variables $\delta_1$, $\delta_2$. To simulate spectral responses for the three RGB filters we choose $\rho_1 = 450$ nm, $\rho_2 = 550$ nm, $\rho_3 = 650$ nm.

To optimize the annulus widths $\delta_1$, $\delta_2$, we use the cost function $C_3$ from Eqn. (23). The computations for the optimization are performed using the Matlab optimization routine fmincon. The nonlinearity constraint on the filter cell size uses that from Eqn. (27) for $\gamma = 2$. The results of the optimization are shown in Table 3. The column "RBG1:2:1" is the unoptimized partition where the annulus widths are selected to perfectly implement the 1:2:1 area ratios for R, G and B in the aperture plane. The column "RBG optimized" shows the partition optimized as described above.

TABLE 3

Comparison of 1:2:1 partition and optimized partition.

|  | RBG optimized | RBG 1:2:1 |
|---|---|---|
| $\delta_R$ | 0.4666 | 0.5000 |
| $\delta_B$ | 0.2250 | 0.2071 |
| $\delta_G$ | 0.3084 | 0.2929 |
| Crosstalk penalty R | 0.3586 | 0.3275 |
| Crosstalk penalty G | 0.3584 | 0.3841 |
| Crosstalk penalty B | 0.4489 | 0.5111 |
| $I(\rho R)/\Sigma_n I(\rho_n)$ | 0.2470 | 0.3076 |
| $I(\rho G)/\Sigma_n I(\rho_n)$ | 0.5038 | 0.4746 |
| $I(\rho G)/\Sigma_n I(\rho_n)$ | 0.2492 | 0.2178 |

In the optimized partition, the inside red ring width is reduced and the middle blue width is increased compared to the non-optimized case. Even though the unoptimized partition has an exact 1:2:1 area coverage at the filter module, the optimized partition has a better approximation of the 1:2:1 area coverage property at the sensor plane. The optimized partition with the adjusted ring diameters reduces the crosstalk in the B and the G band compared to the non-optimized while simultaneously achieving a better approximation of the 1:2:1 ratio at the sensor (last three rows of the table).

Equalizing SNR. Detector response typically is not constant over its wavelength range. Most silicon detectors are less sensitive in the blue regions than in the green region. Therefore, the blue channel of an RGB image is often more noisy than the green channel. In order to compensate for such loss of sensitivity and related increase of noise, we can design the filter module such that the signal-to-noise-ratio of the captured information is constant. For this we define σ(n) to be the per-pixel-variance of the intensity $J(\rho_n)$ and assume it to be constant and uncorrelated for all (s, t) ∈ $A_n$, where $A_n$ is the region at the sensor plane that contains the pixels that receive the spectral response of the signal filtered by response $\rho_n$. The per-pixel SNR can then be defined as $$SNR_p(n) = \log \frac{[J(\rho_n)]^2}{[\sigma(n)]^2}, \qquad (29)$$

where $\overline{J(\rho_n)}$ denotes the average over all pixels in the super-pixel obtaining response from $\rho_n$. The SNR of a super-pixel is defined as $$SNR_{sp}(n) = \log \frac{[I(\rho_n)]^2}{|A_n|^{-1} \cdot [\sigma(n)]^2}, \qquad (30)$$

where $|A_n|$ denotes the number of pixels contained in the region $A_n$.

Now compute the radial filter partition parameters such that $$\log \frac{[I(\rho_n)]^2}{(|A_n|) \cdot [\sigma(n)]^2} = const \text{ for } n = 1, \ldots, N. \qquad (31)$$

The general optimization framework is as follows:

Minimize $C_{diffr}(\mathcal{P}, \mathcal{A}_{constSNR}) =$ (32)

$$\frac{1}{N}\sum_{n=1}^{N}\left(\log\frac{[I(\rho_n)]^2}{(|A_n|)\cdot[\sigma(n)]^2} - \frac{1}{N}\sum_{k=1}^{N}\log\frac{[I(\rho_k)]^2}{(|A_k|)^{-1}\cdot[\sigma(k)]^2}\right)^2$$

subject to $\sum_{n=1}^{N}\delta_n = R$ $\sum_{m=1}^{M(n)}\phi_{n,m} = 2\pi$ $0 \leq \delta_n \leq R$ $0 \leq \phi_{n,m} \leq 2\pi$ $0 \leq \phi_{0,n,m} \leq 2\pi$ $r_{0,n} = \delta_n - r_{0,n-1}$ $h(x) \leq 0$ We analyze the optimization framework for the geometric non-aberrated model. In this case, given a point source, we can assume that $J_{sensor}(\rho_n)(s,t)$=const for all s, t∈$A_n$. Therefore, $$J_{sensor}(\rho_n)(s,t) = J_{sensor}(\rho_n)(s_{n,0}, t_{n,0}). \qquad (33)$$

where ($s_{n,0}, t_{n,0}$) is a reference point inside of $A_n$. The information obtained by integrating $J_{sensor}(\rho_n)$ over the area of $A_n$ results in $$I(\rho_n) = \text{area}(A_n) \cdot J_{sensor}(\rho_n)(s_{n,0}, t_{n,0}) = \beta_n \cdot \text{area}(A_0) J_{sensor}(\rho_n)(s_{n,0}, t_{n,0}), \qquad (34)$$

where $A_0$ is the area of the image of the aperture inside the superpixel and 0<$\beta_n$≤1 and area($A_n$)=$\beta_n$ area($A_0$). If the aperture is partitioned into four filter cells of equal size, then $\beta_n$=1/4 for each segment n=1, . . . , 4.

Assuming the partition to consist of segments of the entire aperture disc, i.e. N=1, $\delta_1$=R, we search for a target distribution {$\beta_1$, . . . $\beta_2$} with 0<$\beta_n$<1 and $\Sigma_n\beta_n$=1, such that Minimize $C_{geom}(P, A_{constSNR}) =$ (34)

$$\frac{1}{N}\sum_{n=1}^{N}\left(\log\frac{[J_{sensor}(\rho_n)(s_n, o, t_n, o)]^2}{\left(\frac{\phi_n}{2\pi}\right)|A_0|^{-1}\cdot[\sigma(n)]^2} - \frac{1}{N}\sum_{k=1}^{N}\log\frac{[J_{sensor}(\rho_k)(s_k, o, t_k, o)]^2}{\left(\frac{\phi_k}{2\pi}\right)|A_0|^{-1}\cdot[\sigma(k)]^2}\right)^2$$

subject to $\sum_{n=1}^{N}\phi_n = 2\pi$ $0 \leq \phi_n \leq 2\pi$

-continued $$0 < \phi_{0,1} < 2\pi$$

$$h_1(x) \leq 0,$$

with optimization variables $\phi_n, \phi_{0,1}, \in \mathbb{R}$.

In the special case that the $\sigma(n)$ is constant for all $n=1, \ldots$ N, a solution for the above optimization problem is given by $$\phi_n = [2\pi (J_{sensor}(\rho_n)(s_{n,0}t_{n,0}))^2 \cdot \Sigma_k (J_{sensor}(\rho_k) (s_{k,0}t_{k,0})^2)^{-1}] \quad (35)$$

As an example, consider designing a filter module for equal SNR for a signal of human skin reflectance spectrum in noise. Given the source spectral radiance $y(\lambda)$ of an object, the intensity for that signal measured at a sensor pixel is expressed as $$J_{sensor}(\rho_n)(s,t) = \int y(\lambda) \cdot U_{sensor}\{t_{\rho_n}\}(\lambda, s, t)\tau(\lambda)d\lambda \quad (36)$$

Figure 11A:
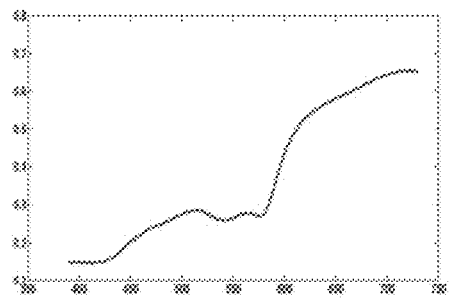
FIGS. 11A-11C show the spectral responses for (A) skin, (B) detector, and (C) four filter cells, for an example design problem.
Figure 12:
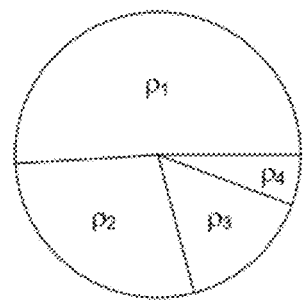
FIG. 12 shows the spatial partition of the filter module for the design problem of FIG. 11.
Figure 11B:
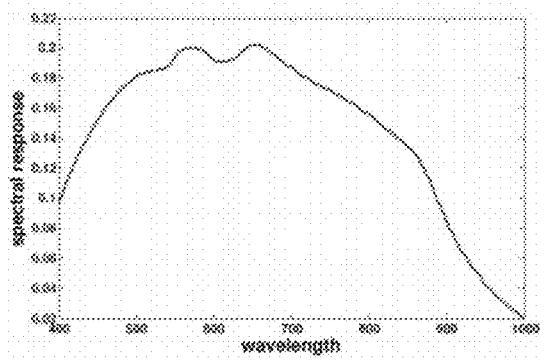
Figure 11C:
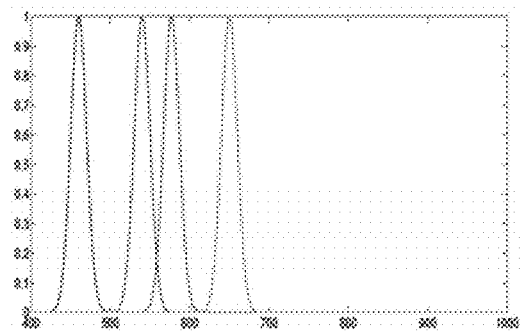

FIGS. 11A-11C show the spectral responses for skin y, the detector τ, and the four filter cells $\rho_1, \ldots \rho_4$, respectively. The spectral responses are modeled as impulse responses with center wavelengths $\lambda_1=450$ nm, $\lambda_2=540$ nm, $\lambda_3=577$ nm and $\lambda_4=650$ nm. We assume the correlation matrix C of the noise to be the identity matrix, i.e. $\sigma(n)=1$ for $n=1, \ldots, 4$. The lens parameters are the same as given in Table 3. The parameterization of the optimized filter partition is calculated using Eqn. (35). The resulting filter module is shown in FIG. 12. The numerical values are $\phi_{1,1}=(0.5074)2\pi$, $\phi_{1,2}=(0.2820)2\pi$, $\phi_{1,3}=(0.1597)2\pi$, $\phi_{1,4}=(0.0508)2\pi$.

Maximizing SNR Using Matched Filters. In this example, we address the problem of how to optimize a filter partition given the goal that the filter cells should result in a matched filter for a given spectral signature and noise distribution. The measurements obtained by N spectral filter cells are modeled as $$x(n) = z(n) + w(n). \quad (37)$$

where z is the known spectral signature and w is noise for $n=1, \ldots N$, N=number of samples. We assume w to be Gaussian noise $w \sim N(0, C)$ with correlation matrix C. The optimum linear matched filter is given by $$h = \frac{C^{-1}z}{z^T C^{-1} z}, \quad (38)$$

and maximizes the SNR at the output of an FIR filter. Variations of the matched filters used in spectral detection tasks include the quadratically constrained matched filter $$h = \frac{(C + \delta_h I)^{-1} z}{z^T (C + \delta_h I)^{-1} z}. \quad (39)$$

and the robust matched filter $$h = \frac{(C + \varsigma^{-1} I)^{-1} z}{z^T (C + \varsigma^{-1} I)^{-1} C (C + \varsigma^{-1} I)^{-1} z}. \quad (40)$$

with loading factors $\delta_h$ and $\varsigma$.

We interpret the coefficients of a matched filter h as the target distribution of the spectral information at the sensor plane. Using the framework described above we can apply the optimization framework described above to the optimization of the matched filter distribution by setting $\alpha = h/\Sigma h_n$.

The following results are based on the same test data as used in the detection experiment described in the previous section.

The signal z is the information extracted from a superpixel, i.e. $y = h^T z = [I(\rho_n)]$ and the noise is assumed to be Gaussian with covariance matrix $C = \text{diag}\,[\sigma(n)]^2$.

For the geometric non-aberrated model, z reduces to $z = J_{sensor}(\rho_n)(s_{n,0}, t_{n,0})$ and the filter taps of h represent the quantities $|A_n|$. For the skin signal, filter responses, and detector response shown in FIGS. 11A-11C, the measurement data result in $z=[0.9427, 1.2646, 1.6803, 2.9783]$. For the case of $C=\text{diag}[1, 1, 1, 1]$ the matched filter from Eqn. (38) is $h=[0.0665, 0.0892, 0.1185, 0.2100]$. After normalization to fit the constraints of the filter entries summing up to $2\pi$, the angular spans corresponding to the matched filter are $\phi_1 = 0.8627$, $\phi_2 = 1.1573$, $\phi_3 = 1.5377$, $\phi_4 = 2.7255$. In contrast, for a covariance of $C=\text{diag}[0.5^2, 1, 1, 0.8^2]$, the matched filter is $h=[0.1727, 0.0579, 0.0769, 0.2131]$ resulting in the filter partition with $\phi_1 = 2.0839$, $\phi_2 = 0.6989$, $\phi_3 = 0.9286$, $\phi_4 = 2.5718$.

In the diffraction model that includes lens aberrations as well as diffraction effects, we apply the optimization framework from above to target distribution $\alpha = [0.1373, 0.1842, 0.2447, 0.4337]$ resulting from $C=\text{diag}[1, 1, 1, 1]$ with corresponding matched filter $h=[0.0665, 0.0892, 0.1185, 0.2100]$. We obtain the optimized results shown in Table 4. The cost function value for the non-optimized case is 0.2549. The cost function value for the optimized result is 0.2280. The optimized spatial partition is a rotation of the non-optimized filter pattern. Further details are shown in Table 4.

TABLE 4

Comparison of optimized and non-optimized matched filters

| | optimized | non-optimized |
|---|---|---|
| $\phi_1$ | 0.8629 | 0.8629 |
| $\phi_2$ | 1.1575 | 1.1575 |
| $\phi_3$ | 1.5377 | 1.5377 |
| $\phi_4$ | 2.7251 | 2.7251 |
| $\phi_{0,1}$ | 0.1384 | 0 |
| Crosstalk penalty for $\lambda_1$ | 0.3063 | 0.2889 |
| Crosstalk penalty for $\lambda_2$ | 0.3032 | 0.3212 |
| Crosstalk penalty for $\lambda_3$ | 0.1302 | 0.1371 |
| Crosstalk penalty for $\lambda_4$ | 0.1536 | 0.1360 |
| $I(\rho)/\Sigma_n I(\rho_n)$ for $\lambda_1$ | 0.1193 | 0.1173 |
| $I(\rho)/\Sigma_n I(\rho_n)$ for $\lambda_2$ | 0.1566 | 0.1495 |
| $I(\rho)/\Sigma_n I(\rho_n)$ for $\lambda_3$ | 0.2495 | 0.2472 |
| $I(\rho)/\Sigma_n I(\rho_n)$ for $\lambda_4$ | 0.4746 | 0.4860 |
| $C_3$ | 0.2280 | 0.2549 |

Detection Application. In this example, we address the problem of how to optimize a filter partition given that the system is designed for a detection task. The detection problem for signal in Gaussian noise is formulated as follows:

$$\mathcal{H}_0: x(n) = w(n)$$

$$\mathcal{H}_1: x(n) = z(n) + w(n),$$

where z is the deterministic signal, w is noise, and x(n) are the observations, for $n=1, \ldots N$, N=number of samples. We assume w to be Gaussian noise $w \sim N(0, C)$ with correlation matrix C. For this detection problem, the test function is $$T(x) = x^T C^{-1} z \quad (41)$$

with deflection coefficient $$d^2 = z_T C^{-1} z \quad (42)$$

The classification performance is optimized for maximum deflection coefficient.

In our system, the signal z is the sensed spectral data integrated over the area $A_n$ that is covered by the image of partition cells with given spectral response $\rho_n$ in a super-pixel.

$$z(n) = I(\rho_n), n = 1, \ldots N, \quad (43)$$

where $I(\rho_n)$ is the information computed from detector data for the spectral response $\rho_n$. The noise is the integrated pixel noise over the integration area $A_n$. If the pixel noise is considered to be Gaussian $N(0, Cp)$, then the noise obtained for a superpixel measurement has distribution $N(0,C)$, where C is the correlation matrix of the variables $\Sigma_{k \in A_n} w_n(k)$ and $(w_n(k))$ is the multivariate Gaussian $N(0, Cp)$. The optimization framework is stated as follows:

$$\text{minimize } C(P, A_{detect}) = -[I(\rho_n)]^T C^{-1} [I(\rho_n)] \quad (44)$$

$$\text{subject to } \Sigma_{n=1}^N \delta_n = R$$

$$\Sigma_{m=1 M(n)} \phi_{n,m} = 2\pi$$

$$0 \leq \delta_n \leq R$$

$$0 \leq \phi_{n,m} \leq 2\pi$$

$$0 \leq \phi_{0,n,m} \leq 2\pi$$

$$r_{0,n} = \delta_n - r_{0,n-1}$$

$$h(x) \leq 0.$$

Although the detailed description contains many specifics, these should not be construed as limiting the scope of the invention but merely as illustrating different examples and aspects of the invention. It should be appreciated that the scope of the invention includes other embodiments not discussed in detail above. For example, other embodiments may include cost functions measuring classification performance such as the Bhattacharya distance, for example when signal and noise are modeled as Gaussian distributions. Alternative classification performance measurements may include structured background models which are used in band-selection for hyperspectral imaging applications. In another embodiment the cost function may measure detection performance of a single molecule in optical background in conjunction with RGB performance for the human visual system. Such an application occurs in fluorescent imaging, when an RGB image of an area and a fluorescent signal response should be captured in one imaging path.

The filter partition layout can also be altered to enable refocusing the image along with multi-modal detection. The cost function for such an application could combine a metric such as a sharpness metric for testing the sharpness in each refocused image along with weighting for each imaging modality. There could also be a metric to ensure an appropriate trade-off between image resolution, number of refocus planes, and multiple imaging modalities (filter partitions). There could also be penalties for diffraction effects like crosstalk.

Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

What is claimed is:

1. A computer-implemented method for designing a filter module for use in an aperture-multiplexed imaging system, wherein the aperture-multiplexed imaging system performs a predefined task, and the aperture-multiplexed imaging system comprises a sensor that captures multiplexed images of an object, the filter module positioned approximately in a conjugate plane to the sensor to provide aperture coding of the multiplexed images, the computer-implemented method comprising:
   receiving a model of the object(s) to be imaged by the imaging system;
   receiving a candidate design for the filter module, the candidate design for the filter module including a candidate spatial partition of filter cells within the filter module;
   simulating the imaging system forming multiplexed images of the object(s), wherein each multiplexed image is aperture coded by the candidate filter module;
   calculating a performance metric as a function of the simulated multiplexed images, wherein the performance metric is indicative of the predefined task; and
   modifying the candidate spatial partition of filter cells in order to improve the calculated performance metric;
   wherein the method is performed by a computer system.

2. The method of claim 1 wherein the spatial partition of filter cells is an array of rectangular filter cells, and the step of modifying the candidate spatial partition comprises modifying the row and/or column boundaries between filter cells.

3. The method of claim 1 wherein the spatial partition of filter cells is a concentric array of annular filter cells, and the step of modifying the candidate spatial partition comprises modifying the boundaries between filter cells.

4. The method of claim 1 wherein the spatial partition of filter cells is a polar array of sector-shaped filter cells, and the step of modifying the candidate spatial partition comprises modifying the boundaries between filter cells.

5. The method of claim 4 wherein the polar array may be off-center, and the step of modifying the candidate spatial partition further comprises modifying a position of the origin for the polar array.

6. The method of claim 1 wherein the spatial partition of filter cells is a concentric array of filter cells that have an annular sector shape, and the step of modifying the candidate spatial partition comprises modifying the radial and/or angular boundaries between filter cells.

7. The method of claim 1 wherein the step of modifying the candidate spatial partition comprises modifying a position of filter cells within the filter module.

8. The method of claim 1 wherein the step of modifying the candidate spatial partition comprises modifying a size of filter cells within the filter module.

9. The method of claim 1 wherein the step of modifying the candidate spatial partition comprises scaling a size of the candidate spatial partition.

10. The method of claim 1 wherein the step of modifying the candidate spatial partition comprises changing a total number of filter cells in the filter module.

11. The method of claim 1 wherein the filter module further comprises guard bands between filter cells, and the step of modifying the candidate spatial partition comprises modifying the size and/or position of the guard bands.

12. The method of claim 1 wherein each filter cell is characterized by an optical property, and the method further comprises:
   modifying the optical property of at least one filter cell based on the calculated performance metric.

13. The method of claim 1 wherein the optical property is a spectral filter response.

14. The method of claim 1 wherein the optical property is a polarization filter response.

15. The method of claim 1 wherein improving the performance metric reduces crosstalk between the aperture coding of adjacent multiplexed images.

16. The method of claim 15 wherein different filter cells are characterized by different spectral filter responses, and the performance metric reduces spectral crosstalk between adjacent multiplexed images.

17. The method of claim 1 further comprising:
based on the calculated performance metric, modifying a design of the imaging system in conjunction with modifying the candidate design for the filter module.

18. The method of claim 1 wherein the predefined task is a detection of a substance based on its spectral properties.

19. The method of claim 1 wherein the predefined task is a detection of a presence of an object in noise.

20. A non-transitory computer readable medium containing software instructions than, when executed on a computer system, cause the computer system to perform the steps of:
receiving a model of an object(s) to be imaged by the imaging system;
receiving a candidate design for the filter module, the candidate design for the filter module including a candidate spatial partition of filter cells within the filter module;
simulating the imaging system forming multiplexed images of the object(s), wherein each multiplexed image is aperture coded by the candidate filter module;
calculating a performance metric as a function of the simulated multiplexed images, wherein the performance metric is indicative of the predefined task; and
based on the calculated performance metric, modifying the candidate spatial partition of filter cells in order to improve the calculated performance metric.

* * * * *

UNITED STATES PATENT AND TRADEMARK OFFICE
CERTIFICATE OF CORRECTION

PATENT NO. : 8,949,078 B2
APPLICATION NO. : 13/040809
DATED : February 3, 2015
INVENTOR(S) : Kathrin Berkner and Sapna Shroff It is certified that error appears in the above-identified patent and that said Letters Patent is hereby corrected as shown below:

Title Page, Item (54) and in the Specification, at Column 1, lines 1 and 2, Title should read "DESIGN OF FILTER MODULES FOR APERTURE-CODED, MULTIPLEXED IMAGING SYSTEMS."

Signed and Sealed this
Twenty-second Day of March, 2016

Michelle K. Lee
*Director of the United States Patent and Trademark Office*